US007633160B1

(12) United States Patent
Lee et al.

(10) Patent No.: US 7,633,160 B1

(45) Date of Patent: Dec. 15, 2009

(54) WINDOW-TYPE SEMICONDUCTOR PACKAGE TO AVOID PEELING AT MOLDFLOW ENTRANCE

(75) Inventors: Chuang-Fa Lee, Hsinchu (TW); Chao-Hsiang Leu, Hsinchu (TW); Tseng-Shin Chiu, Hsinchu (TW)

(73) Assignee: Powertech Technology Inc., Hsinchu (TW)

(*) Notice: Subject to any disclaimer, the term of this patent is extended or adjusted under 35 U.S.C. 154(b) by 0 days.

(21) Appl. No.: 12/269,440

(22) Filed: Nov. 12, 2008

(51) Int. Cl.
*H01L 23/498* (2006.01)

(52) U.S. Cl. ............................... 257/738; 257/E23.141

(58) Field of Classification Search ......... 257/734–738, 257/678, 782, 784, E23.023, E23.141; 438/612, 438/118

See application file for complete search history.

(56) References Cited

U.S. PATENT DOCUMENTS

2005/0156300 A1* 7/2005 Johnson ...................... 257/678
2006/0006508 A1* 1/2006 Mitsuhashi ................. 257/676
2006/0055033 A1* 3/2006 Kheng ........................ 257/734
2008/0090332 A1* 4/2008 Cheng et al. ................ 438/118
2008/0090336 A1* 4/2008 Huang et al. ................ 438/118
2008/0105974 A1* 5/2008 Chen et al. .................. 257/738
2008/0237855 A1* 10/2008 Fan et al. .................... 257/738

FOREIGN PATENT DOCUMENTS

TW I291751 12/2007

* cited by examiner

*Primary Examiner*—Nathan W Ha

(74) *Attorney, Agent, or Firm*—Muncy, Geissler, Olds & Lowe, PLLC

(57) ABSTRACT

A window-type semiconductor package is disclosed to avoid peeling at the moldflow entrance, primarily comprising a substrate, a chip with the active surface attached to the substrate, a die-attaching layer bonding the active surface of the chip to a substrate core of the substrate, a plurality of bonding wires, and an encapsulant. The substrate core has a slot. One end of the slot outside the chip is formed as a moldflow entrance with two or more moldflow blocking lumps protrusively disposed on the substrate core and located at the intersections between one edge of the chip and the two opposing sides of the slot adjacent to the moldflow entrance. Accordingly, the moldflow pressures exerting at the die-attaching layer are blocked to avoid the peeling of the die-attaching layer at the moldflow entrance and to keep a constant die-attaching gap.

15 Claims, 6 Drawing Sheets

210 226 220 212 261 223A 211 221 224A 226 7 7 223C 223C 216 216 8 8 S1 S2 225 225 224B 223 224 226 215 261 223B 215 226

WINDOW-TYPE SEMICONDUCTOR PACKAGE TO AVOID PEELING AT MOLDFLOW ENTRANCE

FIELD OF THE INVENTION

The present invention relates to semiconductor devices, especially to window-type semiconductor packages to avoid peeling at moldflow entrances.

BACKGROUND OF THE INVENTION

Among many existing semiconductor packages, a chip is attached to a substrate by die-attaching layers then is encapsulated by an encapsulant through molding. When a window penetrates through the substrate for electrical connection, the encapsulant is formed on the substrate as well as inside the window. A narrow moldflow entrance at one end of the window connects the top surface of the substrate to the window, therefore, the molding pressure exerts stresses on two opposing die-attaching layers near the moldflow entrance during molding processes causing deformation or volume shrinkage of the die-attaching layer or even penetrate into the interface of the die-attaching layer leading to poor packaging qualities.

As shown in FIG. 1, a conventional window-type semiconductor package 100 primarily comprises a substrate 110, a chip 130, a die-attaching layer 140, a plurality of bonding wires 150, and an encapsulant 160. The substrate 110 includes a substrate core 120 and one layer of bottom solder mask 114. The substrate core 120 has a top surface 121, a bottom surface 122, and a slot 123 penetrating through the top surface 121 and the bottom surface 122 as a window. A die-attaching layer 140 for chip bonding is formed on the top surface 121 of the substrate core 120 of the substrate 110 as shown in FIG. 2. Since there is no solder mask disposed on the top surface 121 of the substrate core 210 so that the die-attaching layer 140 directly bonds the active surface 131 of the chip 130 to the top surface 121 of the substrate core 120. Moreover, the top surface 121 of the substrate core 120 is rough not as smooth as solder mask, therefore, the adhesion of the die-attaching layer 140 can be enhanced. According to the moldflow orientation 161 for forming the encapsulant 160, a moldflow entrance 123A is formed at one end of the slot 123 outside the die-attaching area 124 and a moldflow exit 123B is formed on the other end of the slot 123 outside the die-attaching area 124. The chip 130 has an active surface 131 with a plurality of electrodes 132 formed on the active surface 131. When the active surface 131 of the chip 130 is attached to the substrate core 120 of the substrate 110, the electrodes 132 of the chip 130 are aligned to the slot 123 and the moldflow entrance 123A and the moldflow exit 123B are not covered by the chip 130. A plurality of electrodes 132 of the chip 130 are electrically connected to the corresponding bonding fingers 117 of the substrate 110 by a plurality of bonding wires 150 passing through the slot 123. An encapsulant 160 is formed on the substrate 110 and inside the slot 123 to encapsulate the chip 130 and the bonding wires 150. A plurality of solder balls 170 are disposed on the ball pads 113 of the substrate 110. During formation of the encapsulant 160, as shown in FIG. 2, precursor of the encapsulant 160 follows the moldflow orientation 161 flows from the top surface 121 into the slot 123 through the moldflow entrance 123A and flowing out of the slot 123 through the moldflow exit 123B to completely fill the slot 123 with the encapsulant 160. The die-attaching layer 140 at two opposing sides of the moldflow entrance 123A will experience the exerted moldflow pressures to deform or shrink and will easily be scratched by the silica fillers or particles in precursor of the encapsulant 160 causing the die-attaching layer 140 located close to the moldflow entrance 123A losing stress buffering functions. More the worse, the encapsulant 160 may partially replace the die-attaching layer 140 located at two opposing sides of the moldflow entrance 123A leading to peeling of the die-attaching layer 140.

Furthermore, a conventional semiconductor package to prevent die-attaching material from contaminating the bonding pads is disclosed in Taiwan Patent No. 1291751. Solder mask disposed on a substrate core has at least a die-attaching opening for accommodating die-attaching material and forms two dam bars along two opposing sides of the wire-bonding slot to prevent contamination of bonding pads by the die-attaching material during die-attaching processes. However, it is not an effective solution to avoid the deformation or peeling of the die-attaching layer located at two opposing sides of the moldflow entrance due to moldflow pressures. Moreover, since the solder mask covers around the slot including the moldflow entrance, the opening of the moldflow entrance is even close to the chip causing larger impacts of moldflow pressure on the die-attaching layer located at two opposing sides of the moldflow entrance leading to reliability issues and poor processing yield.

SUMMARY OF THE INVENTION

The main purpose of the present invention is to provide a window-type semiconductor package to avoid peeling at the moldflow entrance.

The second purpose of the present invention is to provide a window-type semiconductor package to maintain a constant die-attaching gap to prevent bleeding of die-attaching layer.

According to the present invention, a window-type semiconductor package to avoid peeling at the moldflow entrance is revealed, primarily comprising a substrate, a chip, a die-attaching layer, a plurality of bonding wires, and an encapsulant. The substrate includes a substrate core, a first moldflow blocking lump, and a second moldflow blocking lump where the substrate core has a top surface, a bottom surface, and a slot penetrating through the top surface and the bottom surface. A die-attaching area is defined on the top surface where a moldflow entrance is formed at one end of the slot outside the die-attaching area. The first moldflow blocking lump and the second moldflow blocking lump are protrusively disposed on the top surface of the substrate core and located at the intersections between one edge of the die-attaching area and two opposing sides of the slot adjacent to the moldflow entrance. The chip has an active surface with a plurality of electrodes disposed on the active surface where the dimension of the active surface is corresponding to the one of the die-attaching area. The active surface of the chip is attached to the top surface of the substrate core by the die-attaching layer with the electrodes of the chip aligned inside the slot and with the moldflow entrance exposed. The electrodes of the chip are electrically connected to the substrate by the bonding wires passing through the slot. The encapsulant is formed on the top surface of the substrate core and filled in the slot through the moldflow entrance to encapsulate the bonding wires.

The window-type semiconductor package according to the present invention has the following advantages and functions:

1. According to the locations of the first moldflow blocking lump and the second moldflow blocking lump, the blocking lumps have slightly extruded portions outside the die-attaching area and disposed at two opposing sides of the moldflow entrance which can effectively block the impacts of the encapsulant moldflow on the die-attaching layer and also effectively reduce the scratches caused by silica fillers or particles inside the encapsulant to avoid deformation or peeling of the die-attaching layer at the moldflow entrance.

2. A constant die-attaching gap can be kept by the portions of the first blocking lump and the second blocking lump disposed within the die-attaching area to avoid bleeding of the die-attaching layer as well as shifting of the blocking lumps.

DETAILED DESCRIPTION OF THE INVENTION

Please refer to the attached drawings, the present invention is described by means of embodiments below.

Figure 1:
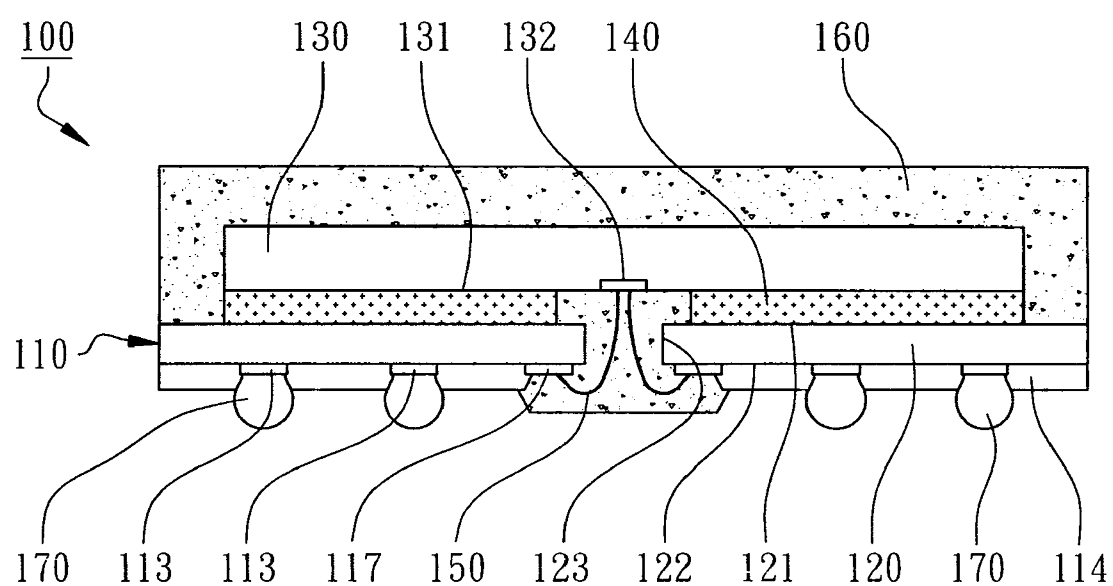
FIG. 1 is a cross-sectional view of a conventional window-type semiconductor package.
Figure 2:
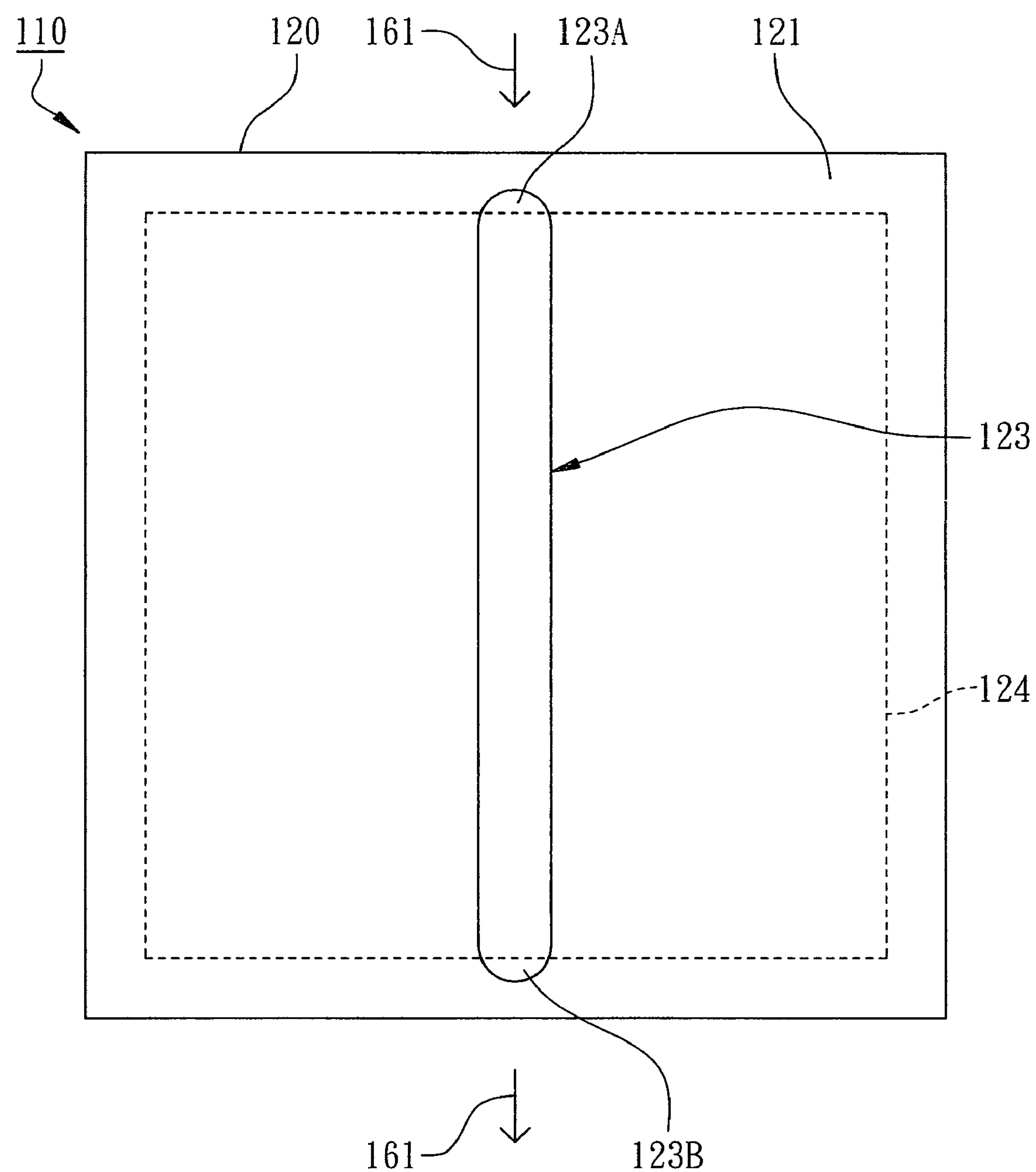
FIG. 2 is a top view of the substrate of the conventional window-type semiconductor package in FIG. 1.
Figure 3:
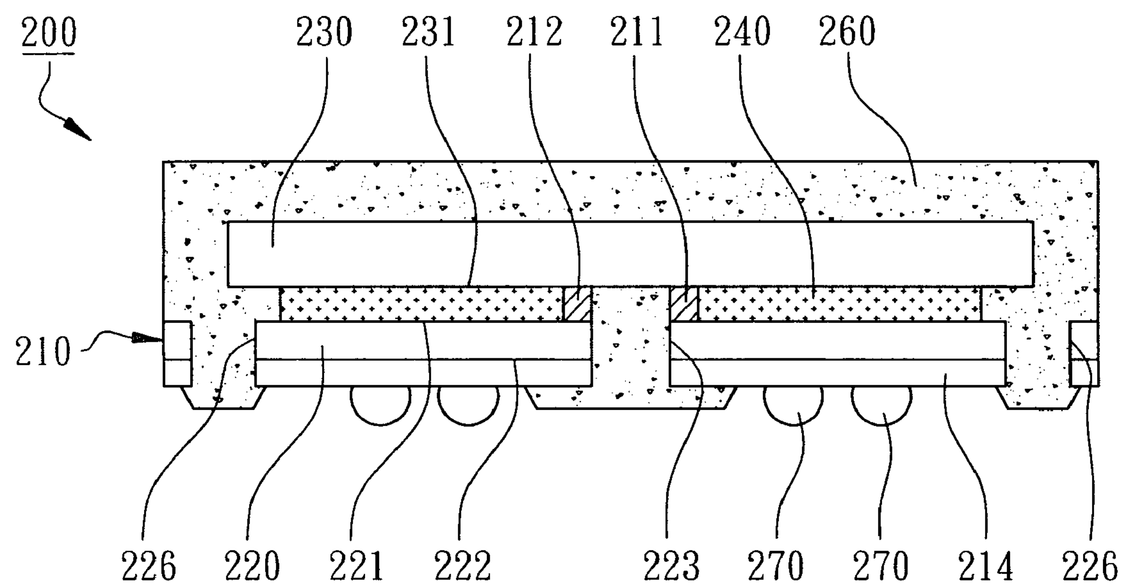
FIG. 3 is a cross-section view of a window-type semiconductor package across the moldflow entrance according to the preferred embodiment of the present invention.
Figure 4:
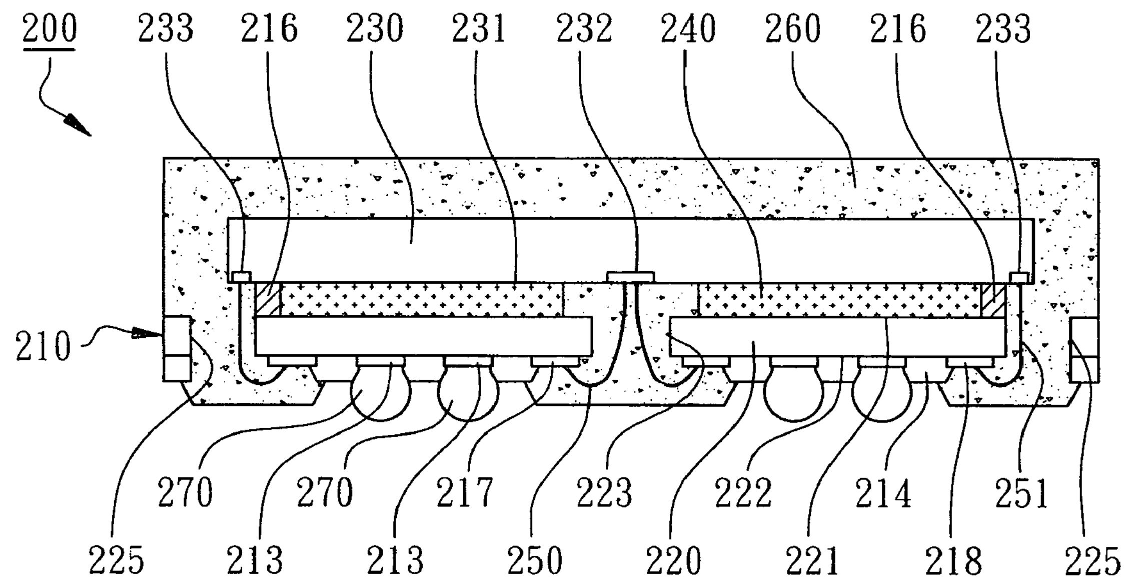
FIG. 4 is a cross-sectional view of the window-type semiconductor package across the center of the slot according to the preferred embodiment of the present invention.

According to the preferred embodiment of the present invention, a window-type semiconductor package to avoid peeling at the moldflow entrance is illustrated with a cross-section view across the moldflow entrance of FIG. 3 and with a cross-sectional view across the center of the slot of FIG. 4.

A window-type semiconductor package 200 primarily comprises a substrate 210, a chip 230, a die-attaching layer 240, a plurality of bonding wires 250, and an encapsulant 260 where the substrate 210 comprises a substrate core 220. The substrate is further illustrated with a top view of FIG. 5, with a bottom view of FIG. 6, with a cross-section view of FIG. 7 taken along line 7-7 of FIG. 5, and with a cross-section view of FIG. 8 taken along line 8-8 of FIG. 5.

Figure 5:
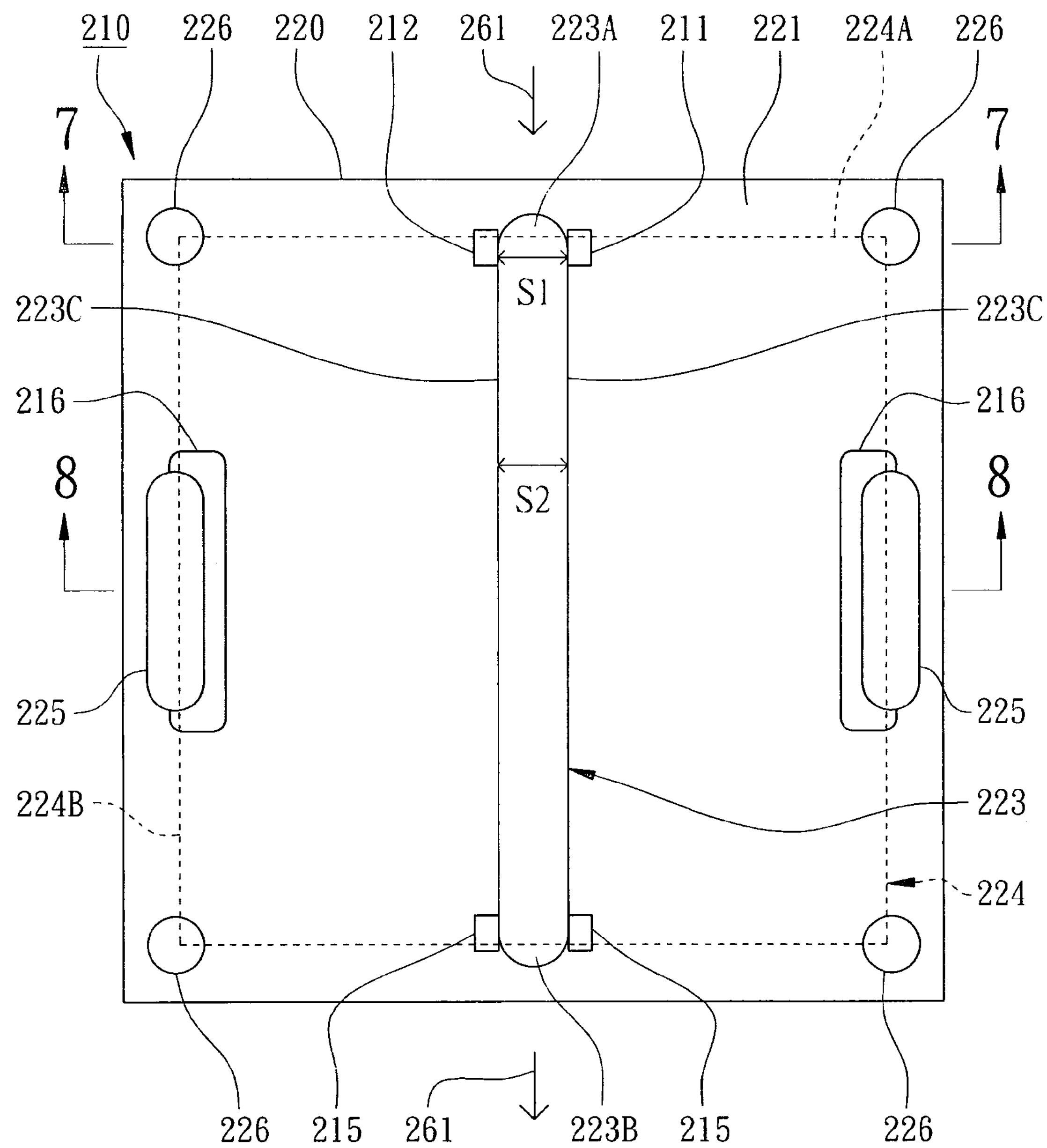
FIG. 5 is a top view of the substrate of the window-type semiconductor package according to the preferred embodiment of the present invention.

The substrate core 220 has a top surface 221, a bottom surface 222, and a slot 223 where the slot 223 penetrates through the top surface 221 and the bottom surface 222. In this embodiment, the slot 223 is formed along a central line of the substrate 210 as shown in FIG. 5. As shown in FIG. 4, the top surface 221 is the surface of the substrate core 220 to carry the chip 230 and the bottom surface 222 is the surface of the substrate core 220 to dispose external terminals. The slot 223 is a window to pass a plurality of bonding wires 250 for electrical connections. As shown in FIG. 5, a die-attaching area 224 is defined on the top surface 221 to make one end of the slot 223 outside the die-attaching area 224 to be a moldflow entrance 223A where the moldflow entrance 223A is a flowing channel for the precursor of the encapsulant 260 to flow and fill into the slot 223 from the top surface 221. The die-attaching area 224 is the footprint of the chip 230 on the substrate 210. A moldflow exit 223B is formed at the other end of the slot 223 outside the die-attaching area 224. The moldflow orientation 261 is the flowing and filling direction of the precursor of the encapsulant 260 flowing from the moldflow entrance 223A toward the moldflow exit 223B. The substrate core 220 is the basic structure of the substrate 210 such as glass fiber fabrics mixed with resin and is formed by lamination of one or multiple layers to provide basic strengths and stiffness of the substrate 210. In the present embodiment, the substrate core 220 is only formed by one or more layers of glass fiber fabric with resin. More than 60% of the area of the die-attaching area 224 on the top surface 221 is designed for die attachment to enhance die-attaching strengths and to reduce package heights. Furthermore, the area outside the die-attaching area 224 on the top surface 221 is designed for direct encapsulation by the encapsulant 260 to enhance the adhesions between the substrate 210 and the encapsulant 260. In another embodiment, the substrate core 220 can further include a solder mask, not shown in the figures, to offer the top surface 221 with the increase of the moldflow-blocking heights.

As shown in FIG. 3, the substrate 210 further includes a first moldflow blocking lump 221 and a second moldflow blocking lump 222 protrusively disposed on the top surface 221 of the substrate core 220. Moreover, as shown in FIG. 3, the first moldflow blocking lump 221 and the second moldflow blocking lump 222 are located at the intersections between the first edge 224A of the die-attaching area 224 and the two opposing sides 223C of the slot 223 adjacent to the moldflow entrance 223A. The deposition of the first moldflow blocking lump 221 and the second mold flow blocking lump 222 has the following functions. Firstly, the moldflow pressures exerted on the die-attaching layer 240 at two opposing sides of the moldflow entrance 223A can be effectively blocked to avoid the random insertion of the encapsulant 260 into the die-attaching gaps leading to variation of die-attaching strengths. Secondly, a constant die-attaching gap can be kept to avoid bleeding of the die-attaching layer 240 without the issues of die-attaching voids that can not be encapsulated by the encapsulant 260 due to blocking the die-attaching layer 240. Thirdly, the small volumes of the first moldflow blocking lump 211 and the second moldflow blocking lump 212 can reduce the footprints on the top surface 221 of the substrate core 220 without affecting the adhesions to the die-attaching layer 240 and to the encapsulant 260. Normally, the footprints of the first moldflow blocking lump 211 and the second moldflow blocking lump 212 can not be greater than 10% of the top surface 221 of the substrate core 220.

The materials of the first moldflow blocking lump 211 and the second moldflow blocking lump 212 can be solder resisting material or others. Preferably, the first moldflow blocking lump 211 and the second moldflow blocking lump 212 are parts of the solder mask but individually disposed without connecting to others. Therefore, within the same solder mask patterning processes, the positions of the first moldflow blocking lump 211 and the second moldflow blocking lump 212 can be accurately disposed with the same height at the same time to achieve lower cost and higher accuracy disposition of blocking lumps. In one of the embodiment, as shown in FIG. 5, the gap S1 between the first moldflow blocking lump 211 and the second moldflow blocking lump 212 can not be smaller than the width S2 of the slot 223 so that the flowing of the encapsulant 260 into the slot 223 through the moldflow entrance 223A will not be blocked.

To be more specific, a plurality of supporting lumps 215 are also protrusively disposed on the top surface 221 of the substrate core 220 and located adjacent to two opposing sides of the moldflow exit 223B. The supporting lumps 215 are formed with the same solder mask as the first moldflow blocking lump 211 and the second moldflow blocking lump 212 where the supporting lumps 215 are individually disposed without connecting others. Furthermore, the numbers, the locations, and the shapes of the slot 223 can be adjusted according to the chips 230 so that the electrodes of the chip 230 can be aligned inside the slot for internal electrical connections. In the present embodiment, the slot 223 is a central slot because of central electrodes. The substrate core 220 further has a plurality of peripheral slots 225 penetrating through the top surface 221 and the bottom surface 222 where a plurality of dams 216 are protrusively disposed on the top surface 221 of the substrate core 220 and formed along the peripheral slots 225 within the die-attaching area 224 as shown in FIG. 5. The dams 216 have extended portions from the second edge 224B of the die-attaching area 224. In this embodiment, the dams 216 are U-shaped and disposed on the top surface 221 which openings are located outside the die-attaching area 224. The dams 216 are formed with the same solder mask as the first moldflow blocking lump 211 and the second moldflow blocking lump 212 where the dams 216 are individually disposed without connecting others. Preferably, the moldflow blocking lumps 211 and 212, the supporting lumps 215 or the dams 216 or all are slightly extruded from the die-attaching area 224 as alignment marks for optical or visual inspection to confirm good alignment of the chip 230 to the die-attaching area 224. If the chip 230 is not well aligned to the die-attaching area 224, then one of the first moldflow blocking lump 211, the second moldflow blocking lump 212, the supporting lumps 215, or the dams 216 will be blocked by the chip 230.

Figure 7:
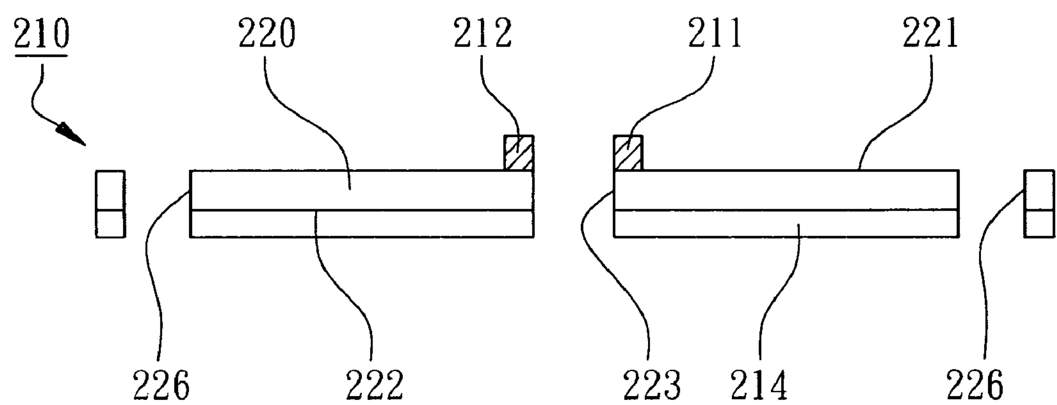
FIG. 7 is a cross-section view taken along line 7-7 of FIG. 5 showing the moldflow blocking lumps adjacent to the moldflow entrance.

The specific shapes of the first moldflow blocking lump 211 and the second moldflow blocking lump 212 are described in detail as follows. As shown in FIG. 5, the first moldflow blocking lump 211 and the second moldflow blocking lump 212 can be bars such as two parallel rectangles slightly extruded from the die-attaching area 224. The first moldflow blocking lump 211 and the second moldflow blocking lump 212 have a length along the corresponding sides 223C of the slot 223 within the die-attaching area 224 within the die-attaching area 224 where the length is greater than the thickness and the width of the first moldflow blocking lump 211 and the second moldflow blocking lump 212 to adjust the area ratio of the first moldflow blocking lump 211 and the second moldflow blocking lump 212 inside and outside the die-attaching area 224 so that the first moldflow blocking lump 211 and the second moldflow blocking lump 212 are ensured to perform moldflow blocking functions along the moldflow direction 261. Furthermore, the first moldflow blocking lump 211 and the second moldflow blocking lump 212 adjacent to the moldflow entrance 223A can not extend to the central section of the corresponding sides 223C of the slot 223, as shown in FIG. 5, FIG. 7 and FIG. 8, to reduce bubbles existed in the gaps between the die-attaching layer 240 and the first moldflow blocking lump 211 or the second moldflow blocking lump 212 so that even there are die-attaching gaps between the die-attaching layer 240 and the moldflow blocking lumps 211 and 212, the die-attaching gaps can be filled by the encapsulant 260.

Figure 6:
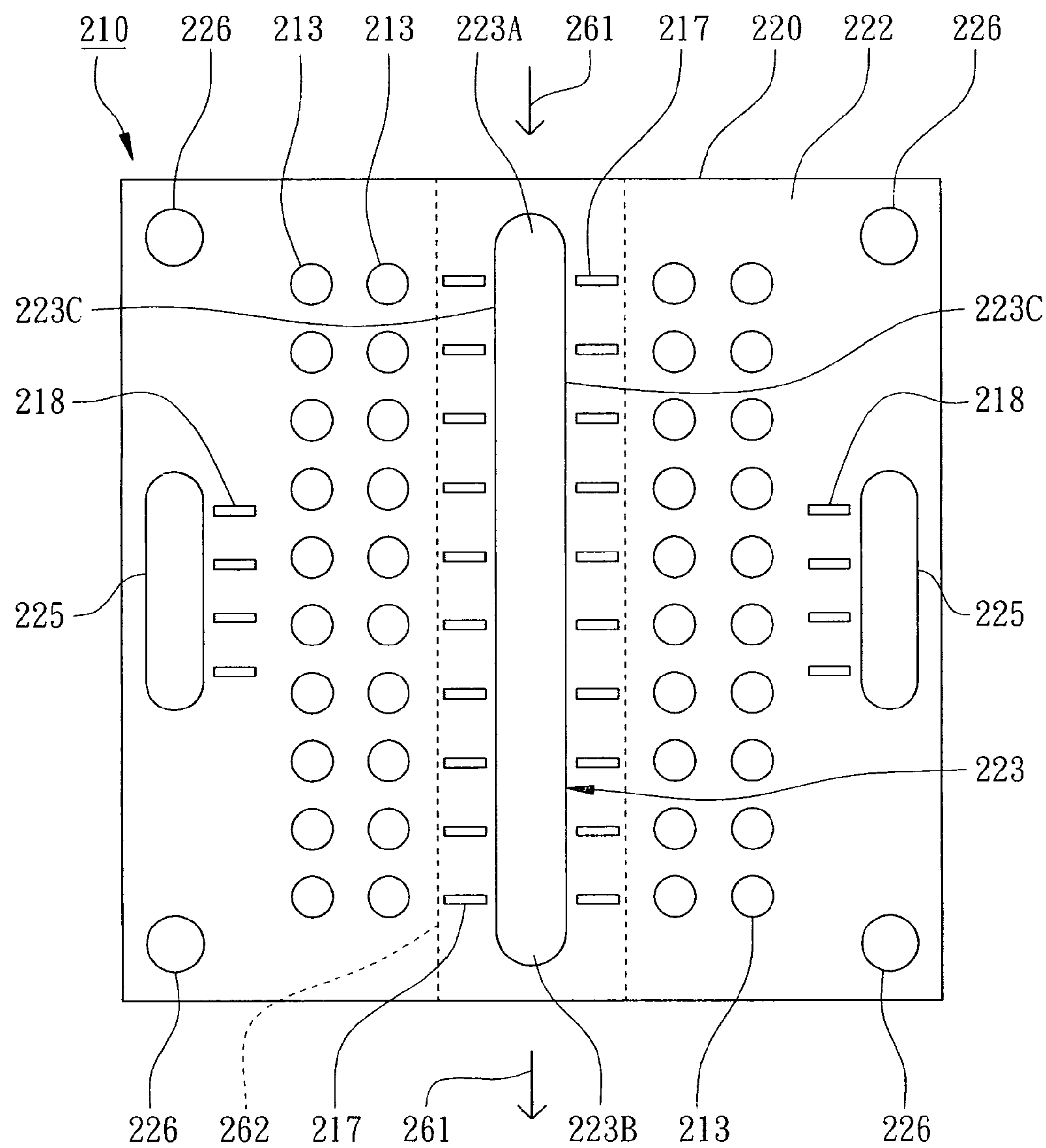
FIG. 6 is a bottom view of the substrate of the window-type semiconductor package according to the preferred embodiment of the present invention.
Figure 8:
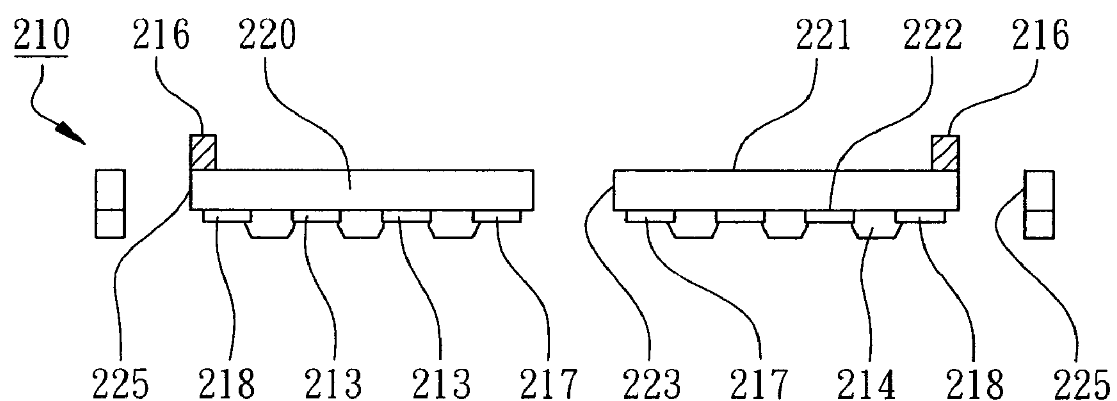
FIG. 8 is a cross-section view taken along line 8-8 of FIG. 5 showing no blocking lumps adjacent to the moldflow entrance.

In the present embodiment, as shown in FIG. 6 and FIG. 8, the substrate 210 further has a plurality of ball pads 213 and a bottom solder mask 214 where the ball pads 213 are disposed on the bottom surface 222 of the substrate core 220 and the bottom solder mask 214 are formed over the bottom surface 222 of the substrate core 220 with the ball pads 213 exposed, as shown in FIG. 8.

As shown in FIG. 3 and FIG. 4 again, the chip 230 has an active surface 231 with a plurality of electrodes 232 formed on the active surface 231 where the IC circuits such as memory cells of the chip 230 are formed on the active surface 231. The electrodes 232 are external terminals for the IC circuits where the electrodes 232 are bonding pads made of aluminum or copper or conductive bumps extruded from the active surface 231. Moreover, the dimension of the active surface 231 is corresponding to the one of the die-attaching area 224. In a more specific structure, the dimension of the die-attaching area 224 is slightly smaller than the one of the top surface 221 of the substrate core 220 to meet the requirement of chip-scale packages (CSP). In the present embodiment, as shown in FIG. 4, the electrodes 232 are disposed at the central area of the active surface 231 where the chip 230 further has a plurality of peripheral electrodes 233 disposed at the peripheral area of the active surface 231.

The active surface 231 of the chip 230 is attached to the top surface 221 of the substrate core 220 of the substrate 210 by the die-attaching layer 240 with the electrodes 232 of the chip 230 aligned in the slot 223, the peripheral electrodes 233 aligned in the peripheral slots 225 and the active surface 231 is aligned with the die-attaching area 224. However, the moldflow entrance 223A is exposed from the chip 230. The die-attaching layer 240 may be B-stage resin, liquid compound, double-sided adhesive tapes or any known die-attaching materials where B-stage resin is preferred for its controllable appropriate viscosity and wettability. Normally, the die-attaching layer 240 contains thermosetting resin. In the present embodiment, as shown in FIG. 5, the length of the first moldflow blocking lump 211 and the second moldflow blocking lump 212 along the corresponding sides 223C of the slot 223 can not be greater than half of the length of the slot 223 or shorter, therefore, the encapsulant 260 can completely fill the die-attaching gaps between the die-attaching layer 240 and the adjacent first moldflow blocking lump 211 or the adjacent second moldflow blocking lump 212 through the slot 223.

As shown in FIG. 4, the electrodes 232 of the chip 230 are electrically connected to the bonding fingers 217 of the substrate 210 by the bonding wires 250 passing through the slot 223 then to the corresponding ball pads 213 through the internal circuitry of the substrate 210, not shown in the figure. The bonding wires 250 may be gold wires formed by wire bonding or inner leads of the substrate. In the present embodiment, the peripheral electrodes 233 of the chip 230 are electrically connected to a plurality of peripheral bonding fingers 218 of the substrate 210 by a plurality of peripheral bonding wires 251 passing through the peripheral slots 225.

The encapsulant 260 is formed on the top surface 221 of the substrate core 220 and filled in the slot 223 through the moldflow entrance 223A to encapsulate the bonding wires 250. Since the encapsulant 260 is formed by transfer molding, therefore, molding pressures will be generated during the formation of the encapsulant 260. The molding pressures exerted at the die-attaching layer 240 located at two opposing sides of the moldflow entrance 233A can be reduced by the slightly extruded portions of the first moldflow blocking lump 211 and the second moldflow blocking lump 212.

Furthermore, as shown in FIG. 4, a plurality of solder balls 270 are disposed at the ball pads 213 of the substrate 210 as external terminals for the semiconductor packages.

In this embodiment but not limited, as shown in FIG. 3, the first moldflow blocking lump 211 and the second moldflow blocking lump 212 can directly contact with the active surface 231 of the chip 230 to offer a minimum die-attaching gap by the thickness of the moldflow blocking lumps 211 and 212.

As shown in FIG. 5, FIG. 6, and FIG. 7, preferably, the substrate core 220 further has a plurality of locking holes 226 located at a plurality of corners of the die-attaching area 214. Moreover, the encapsulant 260 is further filled in the locking holes 226 to increase the bonding strengths between the encapsulant 260 and the substrate 210, as shown in FIG. 3. Furthermore, the corners of the chip 230 are encapsulated by the encapsulant 260 without direct contact with the substrate 210 to reduce stress.

Therefore, the mold pressures exerted on the die-attaching layer 240 can effectively be blocked by the slightly extruded portions of the first moldflow blocking lump 211 and the second moldflow blocking lump 212, moreover, the other portions of the first moldflow blocking lump 211 and the second moldflow blocking lump 212 within the die-attaching area 214 can make the moldflow blocking lumps 211 and 212 fixed on the substrate core 220. The scratches of the die-attaching layer 240 by silica fillers or particles containing in the encapsulant 260 can also be reduced so that peeling or deformation of the die-attaching layer 240 located at two opposing sides of the moldflow entrance 223A can be avoided.

The above description of embodiments of this invention is intended to be illustrative but not limiting. Other embodiments of this invention will be obvious to those skilled in the art in view of the above disclosure.

What is claimed is:

1. A semiconductor package primarily comprising:

a substrate including a substrate core, a first moldflow blocking lump and a second mold flow blocking lump, wherein the substrate core has a top surface, a bottom surface, and a slot penetrating through the top surface and the bottom surface, wherein a die-attaching area is defined on the top surface to make one end of the slot outside the die-attaching area to be a moldflow entrance, wherein the first moldflow blocking lump and the second mold flow blocking lump are protrusively disposed on the top surface of the substrate core and located at the intersections between one edge of the die-attaching area and the two opposing sides of the slot adjacent to the moldflow entrance;

a chip having an active surface and a plurality of electrodes disposed on the active surface;

a die-attaching layer bonding the active surface of the chip to the top surface of the substrate core of the substrate, wherein the electrodes of the chip are aligned in the slot and the active surface is aligned with the die-attaching area with the moldflow entrance exposed;

a plurality of bonding wires passing through the slot and electrically connecting the electrodes of the chip to the substrate; and an encapsulant formed on the top surface of the substrate core and filled in the slot through the moldflow entrance to encapsulate the bonding wires.

2. The semiconductor package as claimed in claim 1, wherein the first moldflow blocking lump and the second mold flow blocking lump are parts of a solder mask but individually disposed without connecting others.

3. The semiconductor package as claimed in claim 2, wherein the gap between the first moldflow blocking lump and the second mold flow blocking lump are not smaller than the width of the slot.

4. The semiconductor package as claimed in claim 1, wherein the areas of the first moldflow blocking lump and the second mold flow blocking lump on the top surface are not greater than 10% of the top surface.

5. The semiconductor package as claimed in claim 1, wherein the first moldflow blocking lump and the second mold flow blocking lump are two parallel rectangulars slightly extruded from the die-attaching area, wherein the length of the first moldflow blocking lump and the second mold flow blocking lump along the corresponding sides of the slot within the die-attaching area is greater than the thickness and the width of the first moldflow blocking lump and the second mold flow blocking lump.

6. The semiconductor package as claimed in claim 1, wherein the first moldflow blocking lump and the second mold flow blocking lump directly contact with the active surface of the chip.

7. The semiconductor package as claimed in claim 1, wherein the substrate further includes a plurality of ball pads and a bottom solder mask, wherein the ball pads are disposed on the bottom surface of the substrate core and the bottom solder mask are formed over the bottom surface of the substrate with the ball pads exposed.

8. The semiconductor package as claimed in claim 1, wherein the other end of the slot is formed as a moldflow exit outside the die-attaching area with a plurality of supporting lumps protrusively disposed on the top surface of the substrate core and located adjacent to two opposing sides of the moldflow exit.

9. The semiconductor package as claimed in claim 8, wherein the supporting lumps, the first moldflow blocking lump and the second mold flow blocking lump are parts of a solder mask but individually disposed without connecting others.

10. The semiconductor package as claimed in claim 8, wherein the supporting lumps, the first moldflow blocking lump and the second mold flow blocking lump are slightly extruded from the die-attaching area.

11. The semiconductor package as claimed in claim 1, wherein the slot is a central slot and the substrate core further has a plurality of peripheral slots penetrating through the top surface and the bottom surface.

12. The semiconductor package as claimed in claim 11, wherein the substrate further includes a plurality of dams protrusively disposed on the top surface of the substrate core and formed along the peripheral slots within the die-attaching area.

13. The semiconductor package as claimed in claim 12, wherein the dams, the first moldflow blocking lump and the second mold flow blocking lump are parts of a solder mask but individually disposed without connecting others.

14. The semiconductor package as claimed in claim 12, wherein the dams are U-shaped.

15. The semiconductor package as claimed in claim 1, wherein the substrate core have a plurality of locking holes located at a plurality of corners of the die-attaching area, wherein the encapsulant is further filled in the locking holes.

* * * * *